United States Patent
Takeda et al.

[11] Patent Number: 5,905,634
[45] Date of Patent: May 18, 1999

[54] SEMICONDUCTOR PACKAGE HAVING A HEAT SLUG

[75] Inventors: Yoshiki Takeda; Takemi Machida; Fumio Kuraishi, all of Nagano, Japan

[73] Assignee: Shinko Electric Industries, Co., Ltd., Nagano, Japan

[21] Appl. No.: 08/929,812

[22] Filed: Sep. 15, 1997

[30] Foreign Application Priority Data

Sep. 18, 1996 [JP] Japan .................................. 8-246043

[51] Int. Cl.⁶ .................................................. H05K 7/20
[52] U.S. Cl. .................... 361/704; 361/690; 361/715; 361/718; 257/676; 257/697; 257/773; 174/16.3
[58] Field of Search ................... 174/252, 16.3, 174/52.4; 257/666, 675, 678, 669, 693, 691, 700, 704, 96, 717, 708, 94, 676, 697, 715, 707, 692, 622, 762, 773; 372/50, 45, 36; 438/271, 122, 174, 118; 361/690, 700, 704, 705, 715, 712, 718, 719, 683, 697

[56] References Cited

U.S. PATENT DOCUMENTS

| | | | |
|---|---|---|---|
| 3,860,949 | 1/1975 | Stoeckert et al. ........................ | 357/65 |
| 5,235,211 | 8/1993 | Hamburgen .............................. | 257/758 |
| 5,478,420 | 12/1995 | Gauci et al. .............................. | 156/89 |
| 5,481,138 | 1/1996 | Economicos et al. ................... | 257/773 |
| 5,622,588 | 4/1997 | Weber ...................................... | 156/263 |

*Primary Examiner*—Leo P. Picard
*Assistant Examiner*—Michael Datskovsky
*Attorney, Agent, or Firm*—Pennie & Edmonds LLP

[57] ABSTRACT

A semiconductor package uses no thermosetting adhesive for mounting a heat slug thereon, which adhesive requires a strict control during the storage and the production thereof. A semiconductor package comprises a circuit board having respective surfaces and an opening; a conductive layer formed on one of the surfaces of the circuit board so that the conductive layers are retracted from a peripheral edge of the opening by a certain distance; a heat slug attached to the one surface of the circuit board by means of solder so that the opening is closed at the one surface and opened at the other surface to form a cavity within which a semiconductor element mounting area is defined; and the heat slug is provided with a groove along a periphery of the semiconductor element mounting area and adjacent the peripheral edge of the opening.

8 Claims, 10 Drawing Sheets

SEMICONDUCTOR PACKAGE HAVING A HEAT SLUG

BACKGROUND OF THE INVENTION

1. Field of the Invention

The present invention relates to a semiconductor package, particularly to such a semiconductor package provided with a heat slug, a heat sink or a heat spreader, hereinafter referred to as a "heat slug", made of metal on a bottom surface of a cavity for mounting a semiconductor element.

2. Description of the Related Art

A conventionally known semiconductor package such as PPGA (Plastic Pin Grid Array), PBGA (Plastic Ball Grid Array) or PLGA (Plastic Land Grid Array) is constructed by overlaying a plurality of resin boards, each composed of an electro-insulating substrate made of glass-epoxy resin, glass-polyimid resin, BT resin or others, on which an electro-conductive layer such as a copper foil is layered, with each other, as shown in FIG. 11.

A structure of the conventionally known semiconductor package 10 will be described with reference to FIGS. 11 to 13. An opening 14 is formed in the overlaid respective resin boards 12 so that a cavity 16 is formed for accommodating a semiconductor element. Circuit boards 20a, 20b carrying circuit patterns 18 on both surfaces thereof are formed by etching the copper foil of the respective resin board.

Bonding portions of the circuit pattern 18 are formed in the vicinity of the periphery of the opening 14, for the connection of the circuit pattern to the semiconductor element by a wire bonding method. A size of the opening 14 in the respective circuit board 20a is selected so that when a laminate is formed by overlaying the circuit boards 20a with each other, the bonding portions are exposed outside in every circuit board 20a. Thus, the size of the opening 14 becomes larger as the position of the circuit board 20a, 20b is higher in the cavity 16 of the lamination of the circuit boards.

The circuit board 20a, 20b is adhered to the other circuit board via a adhesive sheet 22 (prepreg). Also, a resist (not shown) is coated on a surface of the circuit board 20a to smooth the surface and enhance the adhesivity between the circuit boards by the adhesive sheet 22. In this regard, if the characteristics of the adhesive sheet allow, the resist may be eliminated.

On the outer surface of the circuit board 20b, there are formed as a part of the circuit pattern 18 a land 26a for connecting an external terminal 24 (a bump in this case), a conductor 26b for connecting a circuit element such as a capacitor or a resistor, or a conductor 26c for mounting a heat slug made of a metallic plate. A protective coating 28 such as a solder resist is provided on the outer surface of the circuit board 20b, while taking a care that the land 26a and the conductors 26b, 26c are solely exposed.

The external terminal 24, the circuit element and the heat slug 30 are mounted to the land 26a and the conductors 26b, 26c, respectively.

Next, a method for mounting the heat slug 30 to the conductor 26c will be described. First, a thermosetting adhesive 32 is coated on the conductor 26c, and the heat slug 30 is placed on the circuit board 20b while taking a care so that a center of the heat slug 30 coincides with a center of the cavity 16 by using a positioning mechanism. Thereafter, the circuit boards 20a, 20b and the heat slug 30 are pressed together under heat, and the thermosetting adhesive is hardened to bond the heat slug 30 onto the conductor 26c of the circuit board 20b.

However, there is a problem in the prior art semiconductor package mentioned above, which is as follows:

A semiconductor element 34 such as a computer chip is mounted to an attachment area A of the heat slug corresponding to the inner bottom surface of the cavity 16 of the semiconductor package.

Generally speaking, the size of the opening 14 provided in the circuit board 20b having the conductor 26c is selected so that a gap B between the semiconductor element 34 and the peripheral edge of the opening 14 of the circuit board 20b is as small as possible to minimize the contour of the semiconductor package 10 as a whole, while taking account of the size of the attachment area A (in other words, the size of the semiconductor element 34), a positioning accuracy of the positioning mechanism, or a displacement for the scrubbing operation when the semiconductor element 34 is mounted to the attachment area A via an adhesive 36 (scrubbing is an operation for removing air bubbles from the adhesive by pressing and moving the semiconductor element on the heat slug 30).

For this purpose, an amount of adhesive 32, a pressing force and a heating temperature used for bonding the heat slug 30 with the circuit board 20b should be strictly controlled. Otherwise, the adhesive 32 positioned between the heat slug 30 and the conductor 26c is liable to squeeze out from the peripheral edge of the opening of the circuit board 20b along the heat slug 30 toward the attachment area A as shown in FIG. 12, whereby an area for mounting the semiconductor element 34 could not be ensured on the heat slug 30. Contrarily, as shown in FIG. 13, when an end of the adhesive 32 closer to the attachment area A does not reach the peripheral edge of the opening 14, there is a gap 38 between the upper surface of the heat slug 30 and the lower surface of the conductor 26c, which might cause trouble in that, when the semiconductor element 34 is sealed in the cavity 16 with a resin after mounted thereto and wire-bonded to the circuit patterns, an air bubble in the gap 34 might form a pit-like air opening on the surface of the sealing resin to disturb the stamping of product number, or if the air bubble remains within the sealing resin, a crack might be generated in that portion later.

However, the adhesive 32 may vary in hardening property in accordance with the difference between lots or storage conditions. Therefore, it is necessary to strictly control the adhesive not only during the bonding operation for factors such as an amount thereof or a pressure and a temperature but also during the storage thereof, which is very troublesome. Even if well controlled, there may be cases, in accordance with the difference between lots, wherein an end of the adhesive closer to the attachment area A exceeds the peripheral edge of the opening 14 of the circuit board 20b (as shown in FIG. 12) or does not reach the same (as shown in FIG. 13). Therefore, it is very difficult to locate the end of the adhesive 32 within a predetermined allowable limit C relative to the peripheral edge of the opening 14 as shown by dotted lines in FIG. 13.

SUMMARY OF THE INVENTION

An object of the present invention is to solve the above problems in the prior art by providing a semiconductor package using no thermosetting adhesive for mounting a heat slug thereon, which adhesive requires strict control during the storage and the production thereof.

According to the present invention, there is provided a semiconductor package comprising: a circuit board having respective surfaces and an opening; a conductive layer formed on one of the surfaces of the circuit board so that the conductive layer is retracted from a peripheral edge of the opening by a certain distance; a heat slug attached to the one surface of the circuit board by means of solder so that the opening is closed at the one surface and opened at the other surface to form a cavity within which a semiconductor element mounting area is defined; and the heat slug being provided with a groove along a periphery of the semiconductor element mounting area and adjacent the peripheral edge of the opening.

As mentioned above, in the present invention, a solder is used instead of a thermosetting adhesive for bonding a heat slug, which simplifies the manufacturing process of a semiconductor package, because it is unnecessary to reserve the adhesive in a cool state for the purpose of preventing the quality thereof from deteriorating or strictly control the pressing force or the heating temperature during the manufacturing process. Also, the workability is improved because it is unnecessary to locate the heat slug under the strict positioning, because the solder has a self-aligning function.

The solder is capable of spreading widely as a thin layer in an area where a metallic conductive layer exists, by using a wetting property of a metallic conductive layer, but not spreading in an area where no conductive layer exists. It is possible to accurately control an amount of invasion of an end of the adhesive into the attachment area which is a serious problem in the prior art, by varying a distance from the peripheral edge of the opening forming part of the cavity opened in the circuit board to the conductor on which the heat slug is bonded. Thereby, it is possible to prevent the solder from flowing outside of a predetermined allowable range.

Further, an excessive flowing of the solder is prevented, by the groove, from flooding from the peripheral edge of the opening of the circuit board along the heat slug to the attachment area. Thereby, it is possible to assuredly limit the flood of solder within an allowable range by setting the position of the groove in this range.

According to another aspect of the present invention, there is provided a semiconductor package comprising: a circuit board having bottom and upper surfaces, the circuit board comprising: a plurality of resin substrates, each substrate having respective surfaces and an opening, a circuit pattern formed on one of the surfaces of the each substrate, a bonding portion connected to the circuit pattern on the one surface of the substrate, the bonding portion arranged at the vicinity of a peripheral edge of the opening, and the plurality of resin substrates laminated by means of adhesive films therebetween, so that the wire-bonding portions on the respective resin substrates are exposed at peripheral regions of the openings; and a heat slug attached to the bottom surface of the circuit board by means of solder so that the opening is closed at the bottom surface and opened at the upper surface to form a cavity within which a semiconductor element mounting area is defined; and the heat slug provided with a groove along a periphery of the semiconductor element mounting area and adjacent the peripheral edge of the opening.

In this case, the openings of the respective resin substrates have different sizes to form step-like surfaces adjacent to the respective openings, so that the bonding portions are defined on the step-like surfaces. Also, the circuit patterns formed on the one surface of the respective substrates comprise a ground pattern or a power supply pattern and a conductive layer is formed on the other surface of the respective substrates and the conductive layer is electrically connected to the ground or power supply pattern of the circuit pattern.

The solder may be an alloy selected from the group of Sn-Pb, Au-In, Au-Sn, Au-Ge, and Au-Si.

The groove may have a V-shaped cross-section, but may also be of various shapes, such as a U-shaped cross-section.

DETAILED DESCRIPTION OF THE EMBODIMENTS

Figure 1A:
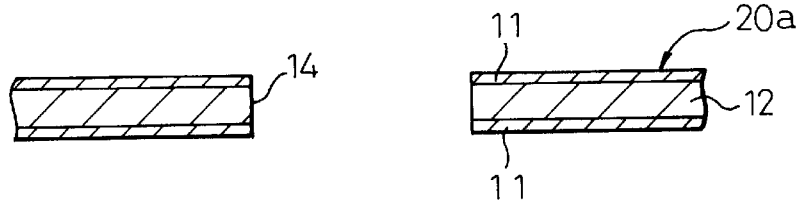
FIGS. 1(a) to 1(e) are illustrations for explaining the steps for producing a circuit board used for a semiconductor device.

The present invention will now be described in more detail below with reference to the preferred embodiments illustrated in the attached drawings.

First Embodiment

A method for producing the semiconductor device will be explained with reference to FIGS. 1(a) to 1(e) and 2, wherein the same reference numerals are used for denoting the same parts as in the prior art.

Steps are shown in FIGS. 1(a) to 1(e), of the preparation for a circuit board used for forming a semiconductor package, from resin substrates, each carrying conductive layers of copper foil on both surfaces thereof.

FIG. 1(a) illustrates a sectional view of a resin substrate 12 carrying copper foil 11 on both surfaces thereof. Reference numeral 14 denotes an opening formed in the resin substrate 12 for defining a cavity 16. The resin substrate 12 is made of electro-insulating resinous material such as glass-epoxy resin, glass-polyimid resin or BT resin.

Figure 1B:
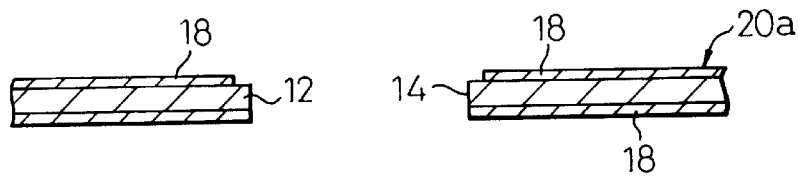
Figure 1C:

In FIG. 1(b), a circuit board 20a is formed by etching the resin substrate 12 to provide circuit patterns 18 on both surfaces thereof. More specifically, the circuit pattern 18 is formed by coating a resist on a surface of the copper foil 11, forming a resist pattern by an exposure in accordance with a predetermined pattern, and removing the copper foil 11 in a portion other than that covered with the resist.

A wire bonding portion of the circuit pattern 18 for the connection to a semiconductor element with a wire-bonding is formed in the vicinity of the peripheral edge of the opening 14. A size of the opening 14 formed in the respective circuit board 20a is selected so that when a laminate is formed by overlaying a plurality of circuit boards 20a with each other, an area for the bonding portion is exposed in the respective circuit board 20a. The size of the opening is determined so that it becomes larger as the position of the circuit board 20a, 20b is higher in the cavity 16 of the lamination of the circuit boards.

Figure 1D:
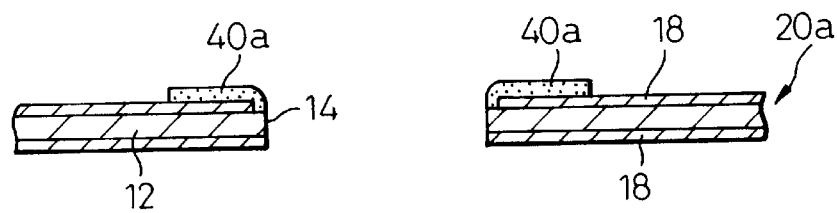

After the copper foil 11 is etched and the circuit pattern 18 is formed, a protective coating is provided for protecting the bonding portion of the circuit pattern 18. In this embodiment, a photoresist 40 is coated on the upper surface of the circuit board 20a (FIG. 1(c)), exposed to light, and dissolved and removed from the circuit board except for a region corresponding to the bonding portion, resulting in the protective coating 40a. In FIG. 1(d), the protective coating 40a is formed on the bonding portion of the circuit pattern 18. In this regard, if it is unnecessary to protect the bonding portion, this process may be eliminated.

Since the circuit boards 20a are bonded to another one via an adhesive sheet 22 (prepreg) therebetween, the protective coating 40a may be eliminated especially on the lower surface of the circuit board 20a.

The protective coating 40a has a function for temporarily protecting the bonding portion but is finally removed therefrom to expose the surface of the circuit pattern 18. Accordingly, the photoresist 40 used for this purpose is preferably one easily removable in the post process, for example, by an alkaline solvent or others.

Figure 1E:
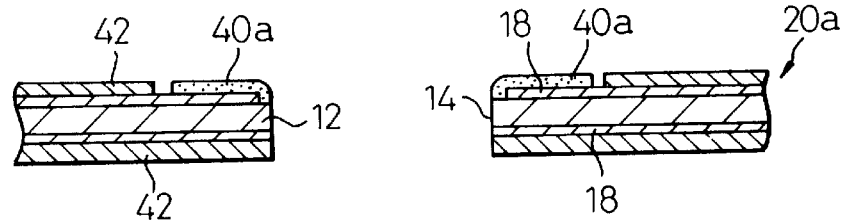

After the bonding portion of the circuit pattern 18 has been covered with the protective coating 40a, a resist 42 is coated on both surfaces of the circuit board 20a to smooth the same (FIG. 1(e)). The resist 42 is coated at a predetermined thickness so that an irregularity is remedied, which is created on the surfaces of the circuit board 20a due to the formation of the circuit pattern 18. The resist 42 is preferably coated by a printing method or others so that the bonding portion of the circuit pattern 18 covered with the protective coating is not coated with the resist 42. The resist 42 may be a solder resist.

The purpose of the resist 42 coated on the surface of the circuit board 20a is to prevent the adhesive sheet 22 from flooding into the cavity by smoothing the surface of the circuit board 20a, and to avoid voids from generating between circuit boards (layers) to reliably bond the same with each other.

It is possible to bond the circuit boards without coating the resist 42, if material of the adhesive sheet allows. Accordingly, the process for coating the resist 42 onto the circuit board 20a is not indispensable.

Figure 2:
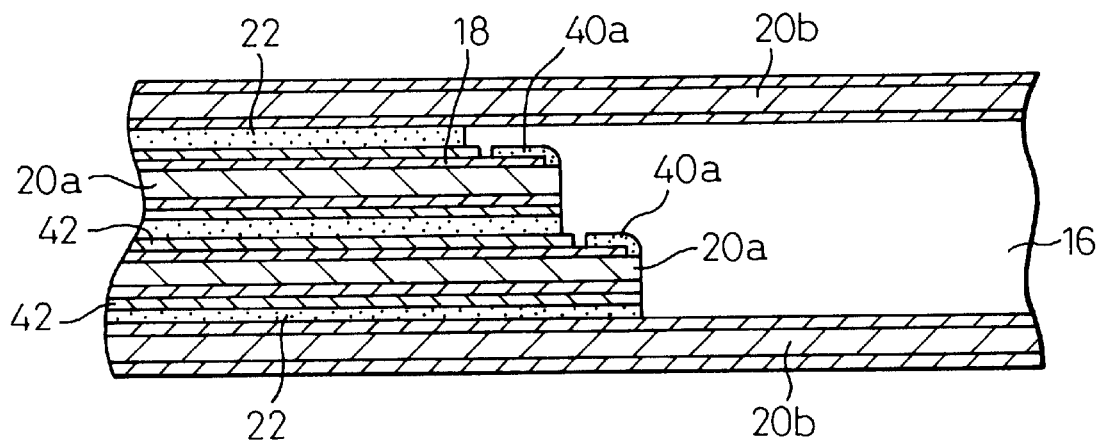
FIG. 2 is a sectional view of a laminate overlying a plurality of substrates with each other.

Next, a laminate is formed by bonding a plurality of circuit boards 20a produced in the above-mentioned manner with each other while sandwiching the adhesive sheet 22 between every adjacent two layers. FIG. 2 shows in an enlarged manner a state wherein two of the circuit boards 20a are bonded together. When the laminate is formed, a circuit board 20b having no opening 14 is provided on each of upper and lower sides of the assembly of the circuit boards 20a to sandwich the latter between the circuit boards 20b and thus seal the cavity 16 from outside.

In this embodiment, a so-called prepreg is used as the adhesive sheet 22. The prepreg is a sheet composed of glass fibers bonded with an adhesive, which is sandwiched between the circuit boards 20a or between the circuit board 20a and the circuit board 20b, and hot-pressed in vacuum for a predetermined time to form an integral laminate after the adhesive is completely solidified.

In this regard, while the respective circuit boards 20a, 20b are overlaid and hot-pressed, a core having a contour complementary to that of the cavity 16 may be inserted into the cavity 16 so that the laminate is pressed uniformly.

The protective coating 40a covering the bonding portion of the circuit pattern 18 has a function for preventing the adhesive of the adhesive sheet 22 from squeezing out of the adhesive sheet 22 and contaminating the bonding portion in the process for bonding the laminated circuit boards with each other. Also, a trouble may be avoidable, wherein debris (such as a piece of glass fiber) falls onto the circuit pattern 18 during the process for positioning the adhesive sheet 22 to the circuit board 20a to contaminate the circuit pattern.

Figure 3:
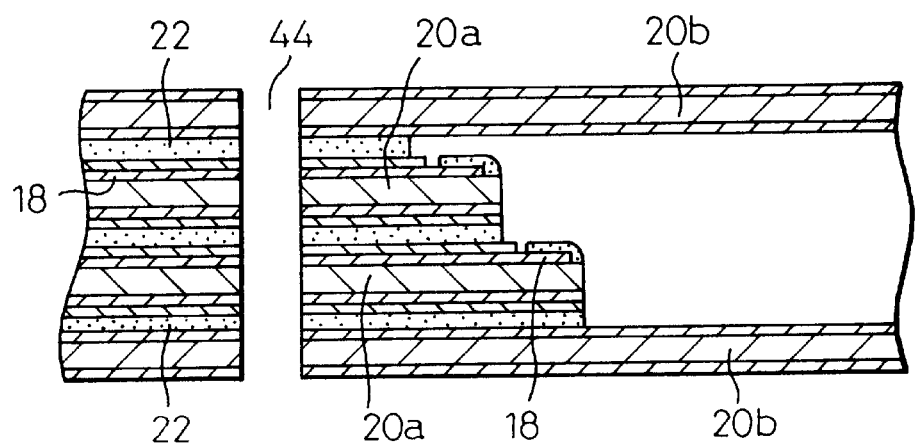
FIG. 3 is a sectional view of the laminate wherein a through-hole is provided in the laminate.
Figure 4:
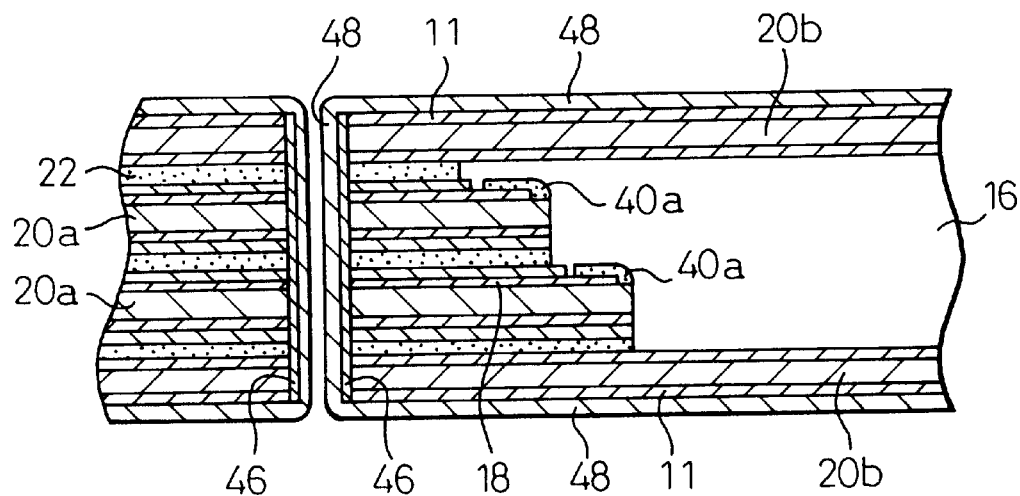
FIG. 4 is a sectional view of the laminate wherein a metal plating is applied to the through-hole.
Figure 5:
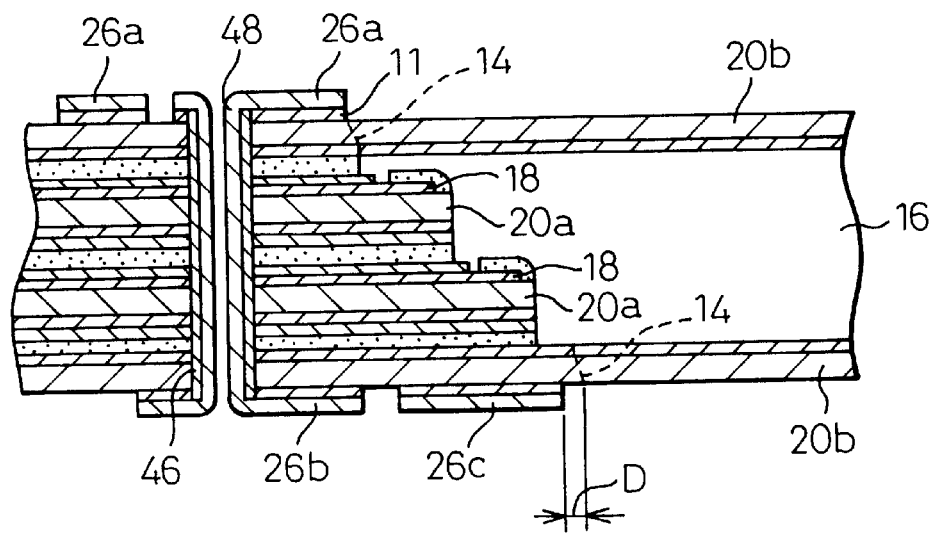
FIG. 5 is a sectional view of the laminate wherein an electro-plated copper coating and a copper foil on the substrate is pattern-formed.

FIGS. 3 to 5 illustrate a process for forming a connection means for connecting the circuit pattern 18 to a land 26a. In FIG. 3, a through-hole 44 is provided at a position at which the connection means is to be formed. The through-hole 44 may be bored by drilling the laminate. In this regard, the circuit pattern 18 of the circuit board 20a may be preliminarily patterned to have a conductivity to the through-hole or not.

Then, the laminate is subjected to an electroless copper plating so that a copper coating 46 is formed on the inner wall of the through-hole 44 and the copper foil on the outer surface of the circuit board 20b. An electro-plating of copper is applied to form a copper coating 48 on the former copper coating 46. FIG. 4 shows a state of the laminate after the electroless and electro-platings have been carried out.

Next, a circuit pattern is formed in the copper coating 48 and the copper foil 11 providing an outer conductive layer of the circuit board 20b by etching the same (FIG. 5). The circuit pattern formed on the outer surface of the circuit board 20b includes the land 26a, the conductor 26b for the connection to an electronic element such as capacitor or resistor and a conductor 26c for mounting a heat slug 30.

As shown in FIG. 5, one of features of this embodiment resides in that the conductor 26c is sized to be located apart by a predetermined distance D from the peripheral edge of the opening 14 defining part of the cavity 16, which opening is formed in the circuit board 20b in the post process. This distance D (a recessed distance) is, for example, in a range from 0.1 to 0.2 mm. However, it is possible to provide this distance more precisely in a micron order because the current machining accuracy of a router for forming the opening 14 or the patterning accuracy for the circuit pattern is highly improved.

As stated above, during the processes for forming the through-hole 44 in the laminate, for carrying out the electro or electroless copper plating, and for etching the copper coating 48 of electro and electroless copper plating and the copper foil 11 to form the circuit pattern, the circuit boards 20a in the interior of the laminate are completely sealed from the outside. Accordingly, there is no risk that the circuit pattern 18 of the circuit board 20a can be damaged by a plating liquid or an etching liquid.

Figure 6:
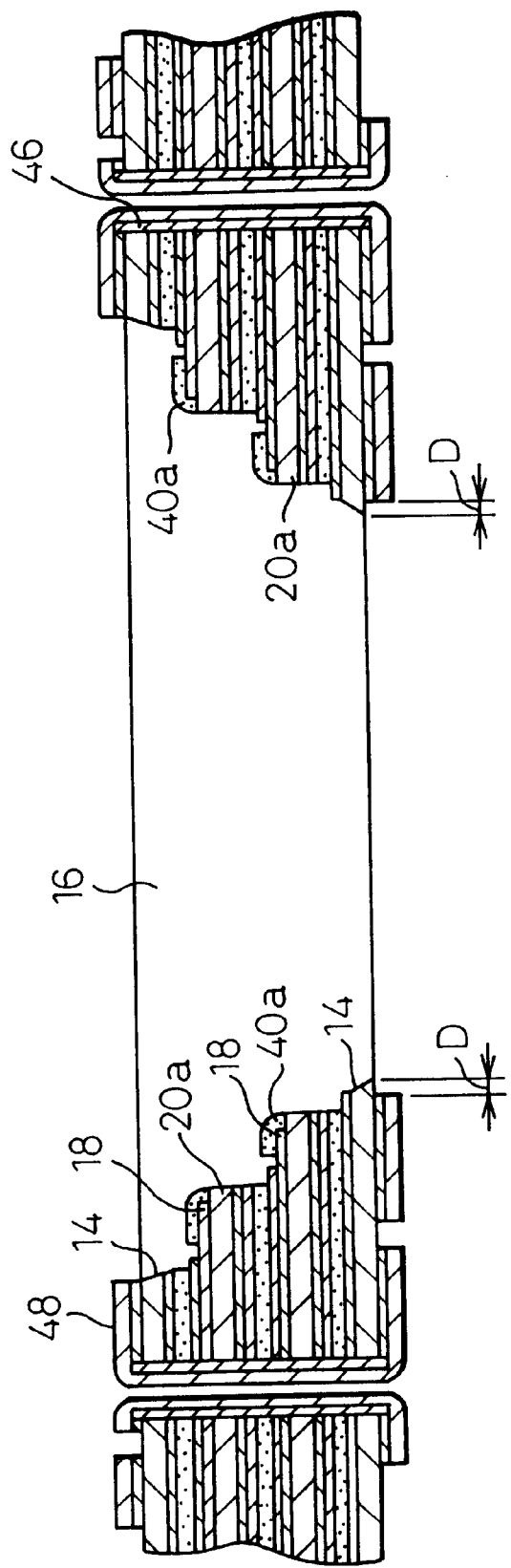
FIG. 6 is a sectional view of the laminate wherein openings are formed in the substrates to form a cavity.

Then, after a protective coating 28 of solder resist or the like is provided on the outer surface of the package except for the land 26a, the conductor 26b for the connection with electronic element and the conductor 26c for mounting the heat slug 30, the opening 14 is formed in the circuit board 20b closely sealing the cavity 16 by using a router or others to open the cavity 16. FIG. 6 shows a state wherein the cavity 16 is made to open by providing the openings in both of the outer circuit boards 20b.

If the process for forming the protective coating 40a on the bonding portion of the circuit pattern 18 has been carried out, the protective coating 40a is removed by using a solvent such as an alkaline solvent after the openings have been provided in the circuit boards 20b to freshly expose the circuit pattern 18. Since the protective coating 40a can be easily removed by the solvent, there is no adverse effect on the circuit pattern 18 or the conductors of the circuit boards 20a.

To ensure the electric connection of the bonding portion with the semiconductor element, a gold plating 50 having a ground of nickel plating is provided on the bonding portion. The gold plating 50 having a ground of nickel plating may be provided also onto the other portions of the circuit pattern 18 such as the land 26a conductive to other circuit patterns.

Figure 7:
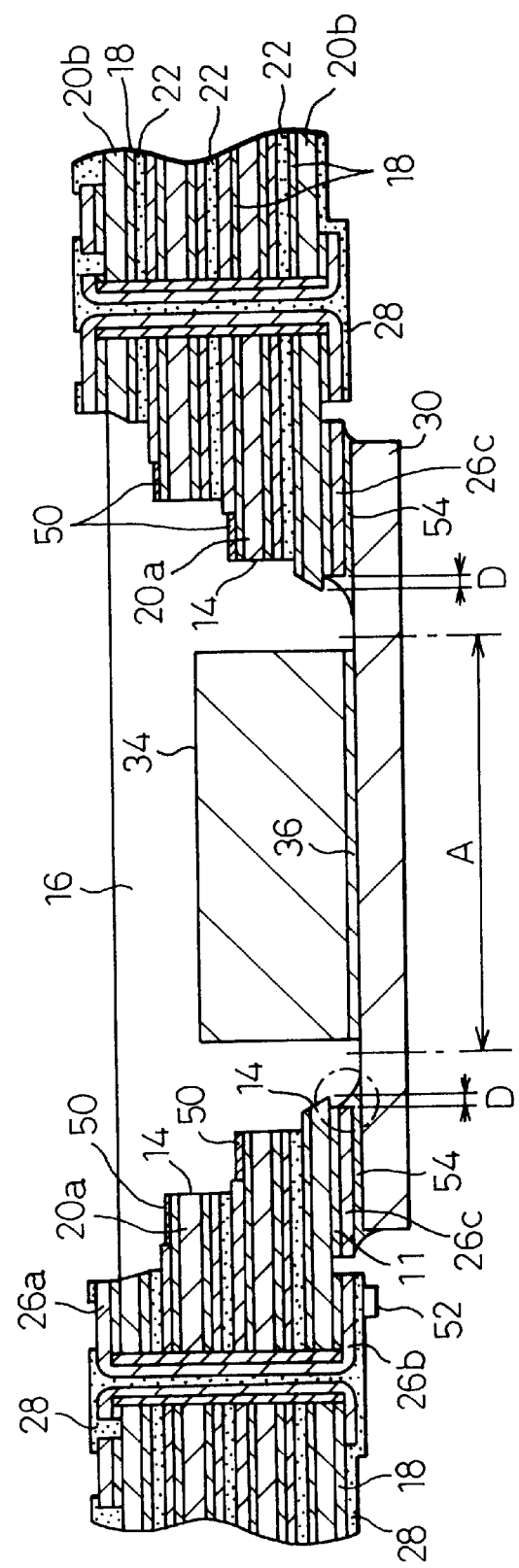
FIG. 7 is a sectional view of a semiconductor package.

FIG. 7 shows a state wherein the heat slug 30 and electronic elements 52 are mounted to the laminate after the above processes have been completed. The heat slug 30 is made of a copper plate on which a nickel plating or a nickel/gold plating is applied.

Steps for mounting the heat slug 30 onto the conductive 26c will be described below. First, the laminate of circuit boards 20a, 20b is positioned so that the conductor 26c faces upward. Then, a solder 54 is coated on the conductor 26c, and the heat slug 30 is placed on the circuit board 20b. The solder 54 may be an alloy of tin and lead mixed at a ratio of 6:4 or an alloy solder including gold (Au/In, Au/Sn, Au/Ge or Au/Si).

Thereafter, the circuit boards 20a, 20b and the heat slug 30 are heated to the melting point of the solder 54. In this step, the heat slug 30 moves on the solder 54 due to the self-alignment function of the solder 54 to be located in a balanced position relative to the arrangement of the conductors 26c, and is fixed there. Thus, the positioning of the heat slug 30 by using the positioning mechanism can be eliminated, which is indispensable in the prior art wherein the resin adhesive is used for bonding the heat slug.

In addition thereto, the solder 54 has a tendency to spread as a thin film on a metallic surface, for example, of the conductor 26a or the heat slug 30 due to the wetting property of the metallic surface but not to spread into a non-metallic area. Accordingly, it is possible to accurately control an amount of invasion of the adhesive into the attachment area which is a serious problem in the prior art within a predetermined allowable range, by varying the recessed distance D from the peripheral edge of the opening 14 provided in the circuit board 20b to the conductor 26c.

As described above, the conductor 26c has a gold plating with a ground plating of nickel, and the heat slug 30 has a nickel plating on the copper surface thereof. Since the wetting property of the gold plating to the solder is superior to that of the nickel plating, it is possible to control the spreading of the solder 54 provided between the conductor 26 and the heat slug 30 by the position of the conductor 26c carrying the gold plating having a higher wetting property. In this regard, the plating for the heat slug 30 may be a gold plating which is the same as in the conductor 26c, a palladium plating, or a silver plating. According to such a surface treatment, the wetting property is improved to reduce the generation of voids between the heat slug 30 and the circuit board 20b.

Figure 8:
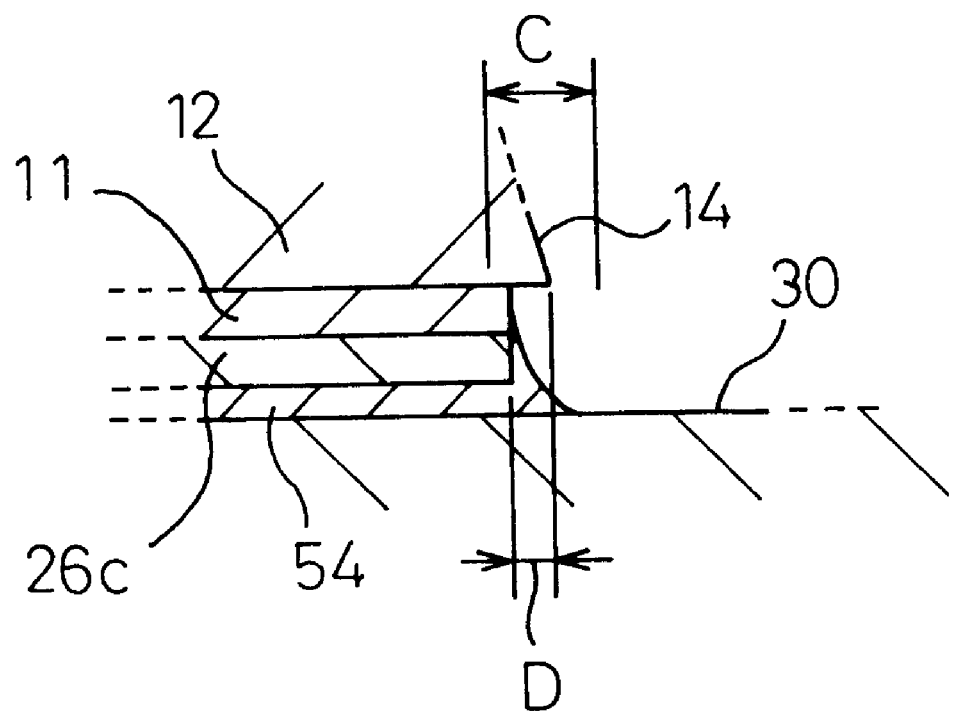
FIG. 8 is an enlarged view of a portion encircled by a chain line in FIG. 7 illustrating a bonding between a conductor and a heat slug.

Also, since an end portion of the solder 54 in contact with a metallic material is tapered as shown in FIG. 8, there is an advantage in that, even if the end of the solder juts out from the allowable range on the heat slug 30, a thickness thereof is very thin and causes no trouble for mounting the semiconductor element 34 thereon.

Further, there is another advantage in that the solder 54 is easily handled because it is unnecessary to store the solder 54 in a refrigerator and strictly control a pressing force or a temperature when used. Also, the solder 54 has a higher adhesivity and thermal conductivity than those of the thermosetting adhesive, resulting in a higher heat-dissipation capability.

Second Embodiment

Figure 9:
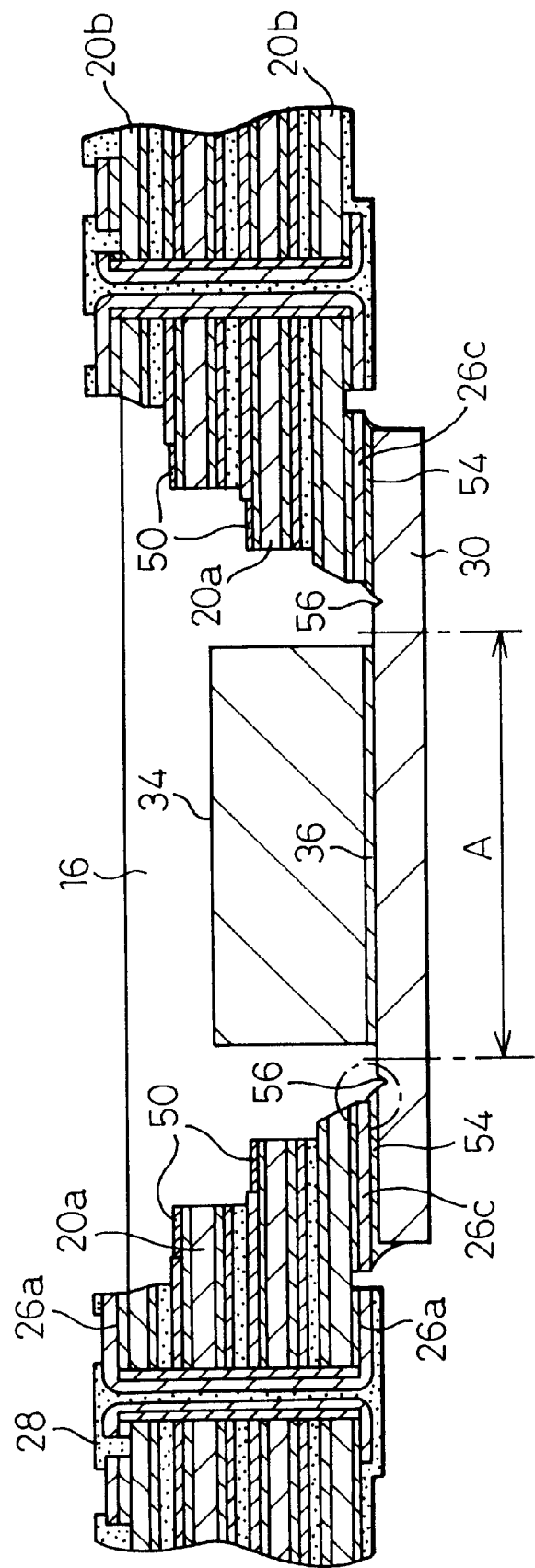
FIG. 9 is a sectional view of another aspect of a semiconductor package.

A basic structure of the second embodiment is substantially the same as that of the first embodiment wherein the heat slug 30 is mounted to the conductor 26c of the circuit board 20b with the solder 54. A feature of the second embodiment resides in that a groove 56 is provided on a surface of the heat slug 30 to be bonded to the circuit board 20b, while encircling the attachment area A for the semiconductor element, as shown in FIG. 9, along the peripheral edge of the opening 14 defining part of the cavity, so that the solder 54 is prevented from extending into the attachment area A by the groove 56. The groove 56 has a V-shaped cross-section in the illustrated embodiment, but may be of various shapes such as a U-shape.

Figure 10:
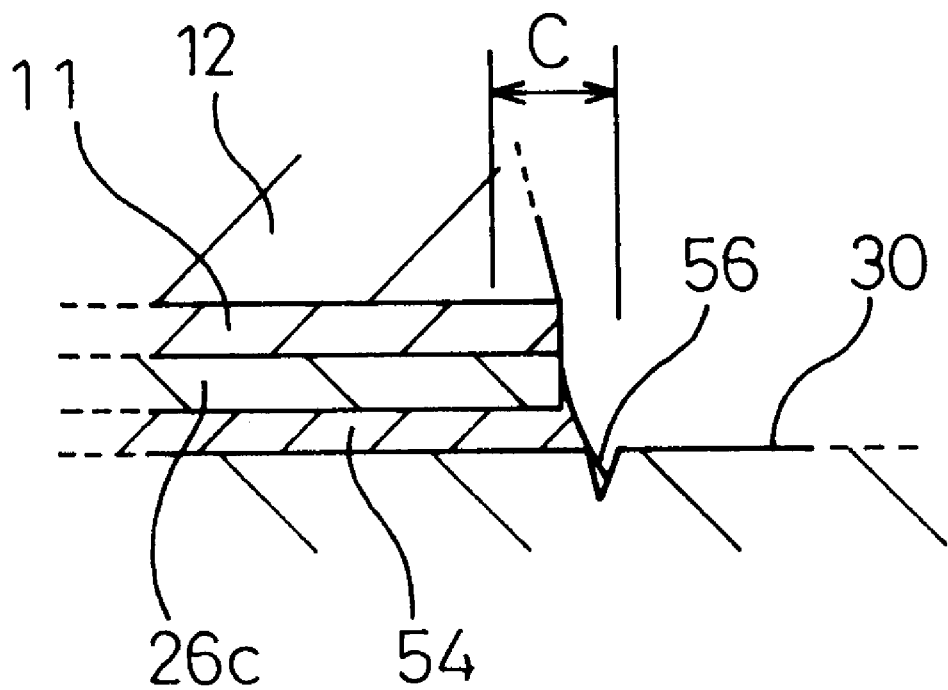
FIG. 10 is an enlarged view of a portion encircled by a chain line in FIG. 7 illustrating a bonding between a conductor and a heat slug.
Figure 11:
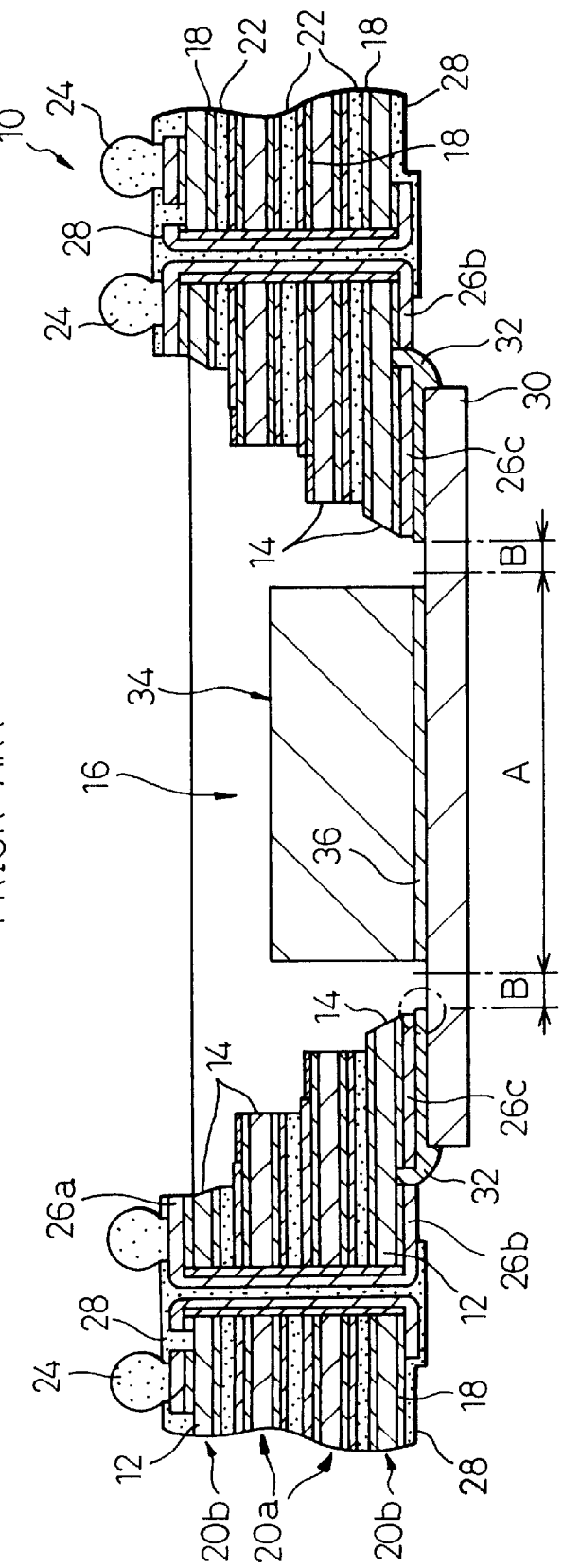
FIG. 11 is a sectional view of a prior art semiconductor package.
Figure 12:
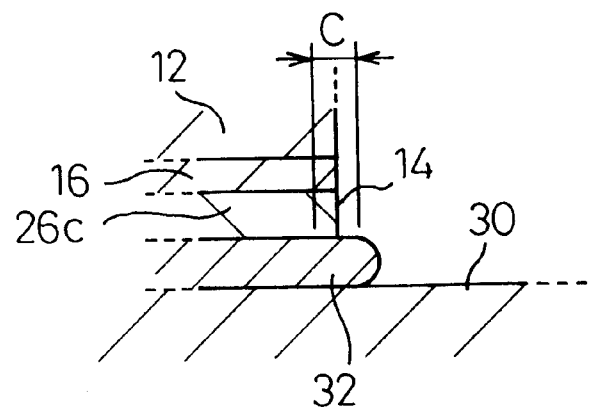
FIG. 12 is an enlarged view of a portion encircled by a chain line in FIG. 11 illustrating a bonding between a conductor and a heat slug (wherein an end of a thermosetting adhesive extends out from an opening)
Figure 13:
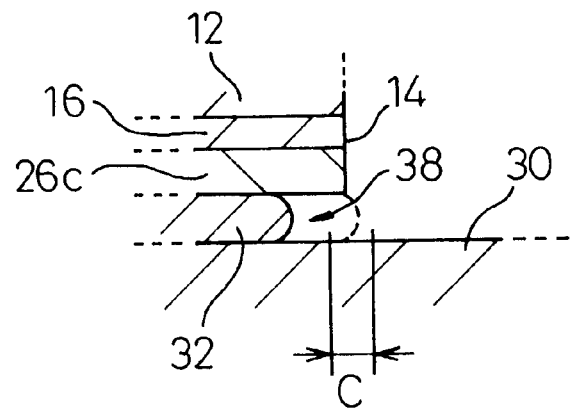
FIG. 13 is an enlarged view of a portion encircled by a chain line in FIG. 11 illustrating a bonding between a conductor and a heat slug (wherein an end of a thermosetting adhesive does not reach the opening).

If the groove 56 is provided within the allowable range C, the solder 54 flowing out along the heat slug 30 dwells in the groove 56 as shown in FIG. 10 and is prevented from invading the attachment area A.

By combining with the structure of the first embodiment, it is possible to further assuredly control an amount of the flowing-out solder 54.

Also, the effect of the solder used for bonding the heat slug 30 as an alternative to the conventional thermosetting resin is the same as in the first embodiment.

While the resin substrate 12 carrying copper foils 11 on both surfaces is used in the above embodiments, a resin substrate carrying the copper foil 11 solely on one surface may be used instead of the former for producing a semiconductor package in the same processes. In the latter case, the copper foil 11 provided on one surface is etched to form the circuit pattern 18, and after coating the bonding portion of the circuit pattern 18 is covered with the protective coating 40a, the laminate is formed by using the adhesive sheet 22 as described before.

While the circuit board 20b is overlaid on a surface of the circuit board 20a for sealing the cavity 16, it is possible to seal the cavity 16 by bonding a resin substrate or an insulating film only to the peripheral edge of the opening of the cavity, which is released therefrom when the cavity is exposed. In short, the concept for sealing the cavity includes the use of the resin substrate or insulating film, and the concept for opening the cavity includes the removal of the resin substrate or the insulating film from the peripheral edge of the opening of the cavity 16.

While the present invention is applied to PLGA in the foregoing embodiments, it is also applicable to PBGA using a solder ball as an external terminal 24 or PPGA using a lead pin as an external terminal 24.

In the above description, only one package is treated, but in the actual process, a plurality of semiconductor packages are produced at once while using a large size resin substrate. Accordingly, the patterning of circuit patterns, coating of resist and lamination of substrates with adhesive sheets are carried out while using large size substrate.

While the groove 56 is provided in the heat slug 30 to prevent the solder 54 from flowing over the allowable range C into the attachment area A in the second embodiment, it is possible to provide a rib encircling the attachment area A, instead of the groove 56, by a pressing or etching, or to raise the attachment area A as a whole above a bonding surface between the heat slug 30 and the circuit board 20b.

It should be understood by those skilled in the art that the foregoing description relates to only some preferred embodiments of the disclosed invention, and that various changes and modifications may be made to the invention without departing from the spirit and scope thereof.

We claim:

1. A semiconductor package comprising:

a circuit board having respective surfaces and an opening;

a conductive layer formed on one of the surfaces of the circuit board so that said conductive layer is retracted from a peripheral edge of said opening by a certain distance;

a heat slug attached to said one surface of the circuit board by means of solder so that said opening is closed at said one surface and opened at the other surface to form a cavity within which a semiconductor element mounting area is defined; and said heat slug is provided with a groove along a periphery of said semiconductor element mounting area and adjacent said peripheral edge of said opening.

2. A semiconductor package as set forth in claim 1, wherein said solder is an alloy selected from the group of Sn-Pb, Au-In, Au-Sn, Au-Ge, and Au-Si.

3. A semiconductor package as set forth in claim 1, wherein said groove has a V-shaped cross-section.

4. A semiconductor package comprising:

a circuit board having bottom and upper surfaces, said circuit board comprising:

a plurality of resin substrates, each substrate having respective surfaces and an opening, a circuit pattern formed on one of the surfaces of said each substrate, a bonding portion connected to said circuit pattern on said one surface of the substrate, said bonding portion arranged at the vicinity of a peripheral edge of said opening, and said plurality of resin substrates are laminated by means of adhesive films therebetween, so that said wire-bonding portions on the respective resin substrates are exposed at peripheral regions of said openings; and a heat slug is attached to said bottom surface of the circuit board by means of solder so that said opening is closed at said bottom surface and opened at the upper surface to form a cavity within which a semiconductor element mounting area is defined; and said heat slug is provided with a groove along a periphery of said semiconductor element mounting area and adjacent said peripheral edge of said opening.

5. A semiconductor package as set forth in claim 4, wherein said openings of the respective resin substrates have different sizes to form step-like surfaces adjacent to the respective openings, so that said bonding portions are defined on said step-like surfaces.

6. A semiconductor package as set forth in claim 4, wherein said circuit patterns formed on the one surface of the respective substrates comprise a ground pattern or a power supply pattern and a conductive layer is formed on the other surface of the respective substrates and said conductive layer is electrically connected to said circuit pattern.

7. A semiconductor package as set forth in claim 4, wherein said solder is an alloy selected from a group of Sn-Pb, Au-IN, Au-Sn, Au-Ge, and Au-Si.

8. A semiconductor package as set forth in claim 4, wherein said groove has a V-shaped cross-section.

* * * * *